United States Patent
Galbraith et al.

(10) Patent No.: US 6,259,279 B1
(45) Date of Patent: Jul. 10, 2001

(54) HIGH FREQUENCY DETECTION CIRCUIT AND METHOD

(75) Inventors: Mark James Galbraith, Cherry Hinton (GB); Jean Claude Tarbouriech, Ville-la-Grand; Pierre Marie Signe, Saint-Genis-Pouilly, both of (FR)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/493,585

(22) Filed: Jan. 28, 2000

(30) Foreign Application Priority Data

Mar. 1, 1999 (GB) .................................................. 9904449

(51) Int. Cl.[7] ............................... G06F 9/305; H03D 3/00
(52) U.S. Cl. ................................ 327/49; 327/39; 327/47
(58) Field of Search .................................. 327/34, 47, 49, 327/2, 39, 40, 48

(56) References Cited

U.S. PATENT DOCUMENTS

| | | | |
|---|---|---|---|
| 3,950,705 | * 4/1976 | Fuerherm | 327/34 |
| 5,087,828 | * 2/1992 | Sato et al. | 327/34 |
| 5,280,605 | 1/1994 | Young et al. | 395/550 |
| 5,592,111 | 1/1997 | Wong et al. | 327/45 |
| 5,600,792 | 2/1997 | Pockrandt et al. | 375/184.01 |
| 5,619,155 | 4/1997 | Wang | 327/142 |

FOREIGN PATENT DOCUMENTS

| | | | |
|---|---|---|---|
| 0483436A1 | 5/1992 | (EP) . | |
| 363263912 | * 10/1988 | (JP) | 327/42 |

OTHER PUBLICATIONS

UK Search Report (1 pg.).

* cited by examiner

Primary Examiner—Dinh T. Le

(57) ABSTRACT

The present invention is a high frequency detection circuit (10) which includes a high frequency filter (12) and a frequency comparator (14) which compares the output of the high frequency filter with the incoming clock signal to determine if the high frequency filter is in operation. If operating, a status register is set which a microcontroller can poll to determine if an attack has been attempted. A microcode programmer can then control what sequence of events occur once the register has been set. Alternatively, detection of operation of the high frequency filter could automatically trigger a reset or interrupt of the microcontroller.

12 Claims, 5 Drawing Sheets

HIGH FREQUENCY DETECTION CIRCUIT AND METHOD

FIELD OF THE INVENTION

The present invention relates generally to electronic circuits, and more particularly to integrated circuits which detect high frequency signals.

BACKGROUND OF THE INVENTION

A microcontroller is designed to operate at a particular clock frequency or over a range of frequencies. Because the microcontroller may not operate properly at higher frequencies, a microcontroller-based integrated circuit may include some mechanism for detecting an incoming clock signal frequency which is higher than normal and dividing it down to a suitable operating frequency. A typical means for "dividing" the frequency is to regularly skip an incoming clock period. For example, filtering the incoming clock by skipping every other period is effectively dividing the incoming clock by two. The means for detecting and reducing the incoming clock signal is usually referred to as a high frequency filter (HFF). Numerous HFF circuits have been developed to meet the various requirements of individual microcontrollers and the applications in which the microcontrollers will be used.

One microcontroller product which relies on use of an HFF is an integrated circuit for use in a smartcard. Generally, a smartcard is a plastic card, similar in size and shape to a credit-card, which includes a microcontroller-based integrated circuit (IC) with on-chip memory that is embedded within the plastic. Power and data are transmitted to/from the IC either through contacts formed on the card (a contact type card) or using radio frequency signals (a contactless type card). Smartcards are used in electronic purse and credit and debit payment system applications, access control applications (e.g. for pay television and public transportation), and national social service applications, to name a few. Each of these applications require security mechanisms to prevent hackers from being able to gain access to the sensitive information stored in the cards. One security mechanism used in smartcard ICs is the use of a HFF. A hacker can attempt to "break into" the smartcard IC by using a higher than normal input clock frequency. For instance, a smartcard IC may be designed to operate in the range of 5–8 MHz. But a hacker can impose a 10–12 MHz clock signal on the IC in hope that the higher than expected frequency will cause the IC to malfunction and make it easier for the hacker to obtain the desired information. To thwart such an attack, smartcard ICs are designed to include an HFF. With an HFF, a hacker's input clock frequency of 10–12 MHz or even higher is divided down to a suitable operating frequency, e.g. 5–6 MHz, so that the microcontroller operating normally is therefore less susceptible to attack.

However, a disadvantage with the use of an HFF in a smartcard IC, or other IC where security is a concern, is that because the microcontroller only ever sees a suitable clock signal, the microcontroller is not aware if a higher than expected clock frequency is being input and therefore does not know if a high frequency attack is being attempted. Accordingly, it would be advantageous for a microcontroller to be able to determine whether the HFF was operating so that an attempted attack could be detected and the IC guarded against it.

SUMMARY OF THE INVENTION

The present invention is a high frequency detection circuit which includes a high frequency filter and a frequency comparator which compares the output of the high frequency filter with the incoming clock signal to determine if the high frequency filter is in operation. In a preferred embodiment, if the high frequency filter is operating, a status register is set which a microcontroller can poll to determine if an attack has been attempted. A microcode programmer can then control what sequence of events occur once the register has been set. For example, the IC can be forced into a reset state or the microcontroller can poll other operating characteristics to verify that it is an attack.

These and other features, and advantages, will be more clearly understood from the following detailed description taken in conjunction with the accompanying drawings. While two specific embodiments of the invention are illustrated in these drawings, it is noted that other embodiments of the present invention are possible. Accordingly, the invention should be considered to encompass all embodiments which fall with the scope of the appended claims.

DETAILED DESCRIPTION OF A PREFERRED EMBODIMENT

Figure 1:
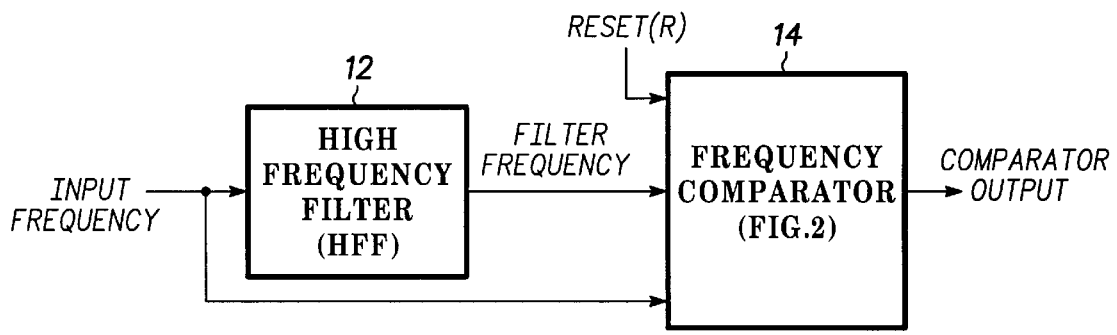
FIG. 1 is block diagram of a high frequency detection circuit in accordance with present invention.

FIG. 1 illustrates, in a block diagram view, a high frequency detection circuit 10 in accordance with the present invention. Circuit 10 may be incorporated onto an integrated circuit which includes a microcontroller (e.g. a smartcard IC). Circuit 10 includes a high frequency filter (HFF) 12 and a frequency comparator 14. An incoming clock signal (labeled INPUT FREQUENCY) is an input to the HFF. The output of the HFF is a clock signal labeled FILTER FREQUENCY. The HFF is designed such that if the INPUT FREQUENCY is less than a predetermined frequency (an uppermost acceptable operating frequency), then the filter does not alter the input clock frequency (i.e. FILTER FREQUENCY=INPUT FREQUENCY). If, on the other hand, the INPUT FREQUENCY is greater than the predetermined frequency, the HFF reduces the frequency to a more suitable frequency (i.e. FILTER FREQUENCY<INPUT FREQUENCY). The particular manner in which the HFF achieves the reduction in frequency is not important for purposes of understanding the present invention. Any known or to-be-developed HFF can be used in accordance with the present invention. Furthermore, the predetermined frequency will vary depending on the design and application of the particular circuit. For purposes of describing the operation of frequency comparator 14 below, it will be assumed that HFF 12 filters a high input clock frequency by dividing it by two until at or below the predetermined frequency.

Frequency comparator 14 receives the INPUT FREQUENCY and the FILTER FREQUENCY as inputs, as also shown in FIG. 1. A RESET signal is also shown as an input for this particular embodiment, although this may not be necessary depending on the particular design of the comparator. Frequency comparator compares the INPUT FREQUENCY with the FILTER FREQUENCY and provides a COMPARATOR OUTPUT signal. If frequency comparator 14 determines that the INPUT FREQUENCY is greater than the FILTER FREQUENCY, the COMPARATOR OUTPUT signal is used, in a preferred embodiment, to set a status register which indicates that the HFF is in operation. Otherwise, the register is left unchanged.

Figure 2:
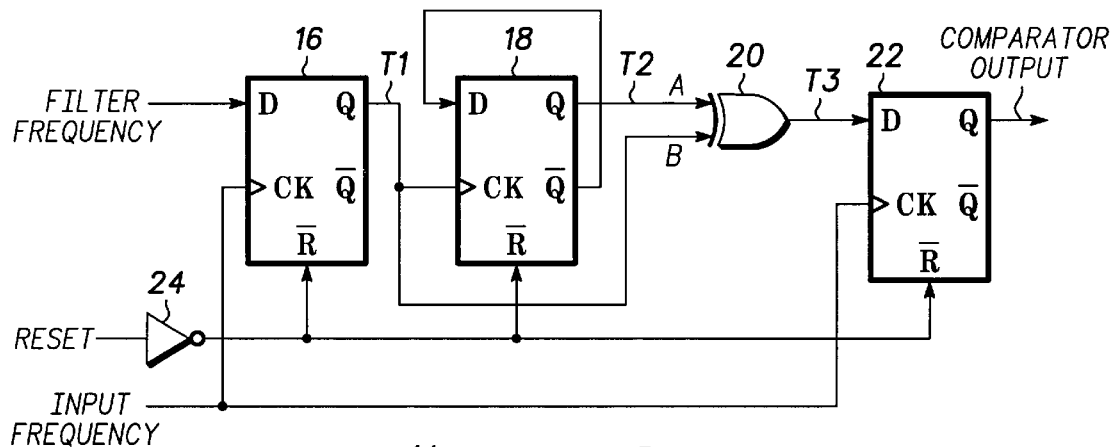
FIG. 2 is a schematic diagram of the frequency comparator from FIG. 1.

FIG. 2 illustrates one suitable design for frequency comparator 14 in schematic form. As shown, frequency comparator 14 includes a first flip-flop 16, a second flip-flop 18, an XOR gate 20, a third flip-flop 22, and an inverter 24. Again, the three inputs to frequency comparator 14 are FILTER FREQUENCY, INPUT FREQUENCY and RESET. The RESET signal is inverted by an inverter 24 and the inverted RESET signal ($\overline{R}$) is coupled to a first input to each of flip-flops 16, 18, and 22. The purpose of providing the RESET signal (or an inverse of the RESET signal) to each flip-flop is to ensure that the state or value of each flip-flop is known at start-up or when coming out of a chip reset. INPUT FREQUENCY is coupled to a second input (CK) of first flip-flop 16, and FILTER FREQUENCY is coupled to a third input (D) of this flip-flop. An output (Q) of first flip-flop 16, labeled as signal T1, is coupled to a second input (CK) of second flip-flop 18. Flip-flop 18 also has an output (Q), labeled as signal T2. An inverse of the output ($\overline{Q}$) of flip-flop 18 is coupled to a third input of this flip-flop. T1 is also coupled to a first input of XOR gate 20 and T2 is coupled to a second input of XOR gate 20. An output of XOR gate 20 is labeled as signal T3. INPUT FREQUENCY is also coupled to a second input (CK) of third flip-flop 22. T3 is coupled to a third input (D) of the third flip-flop. An output of the third flip-flop 22 is the COMPARATOR OUTPUT of circuit 10.

In the particular embodiment illustrated, each flip-flop is a D-type flip-flop. Accordingly, frequency comparator 14 works as follows. For purposes of illustration, assume that upon start-up, or coming out of chip reset, all flip-flops are set to a low (negated) state. As used herein, a low or negated state refers to a logical "0", whereas a high or an asserted stated refers to a logical "1". Alternatively, the flip-flops could be set to a high state, in which case the states of the flip-flops will be the opposite of that described below. After start-up, or coming out of reset, as long as FILTER FREQUENCY equals INPUT FREQUENCY (i.e. the HFF 12 is not filtering the incoming clock), the output of first flip-flop 16 (T1) remains low, and thus the output of second flip-flop 18 (T2) remains unchanged. With T1 and T2 low, the output (T3) of XOR gate 20 is also low, and thus COMPARATOR OUTPUT remains low and the status register remains in its initial state.

Figure 3:
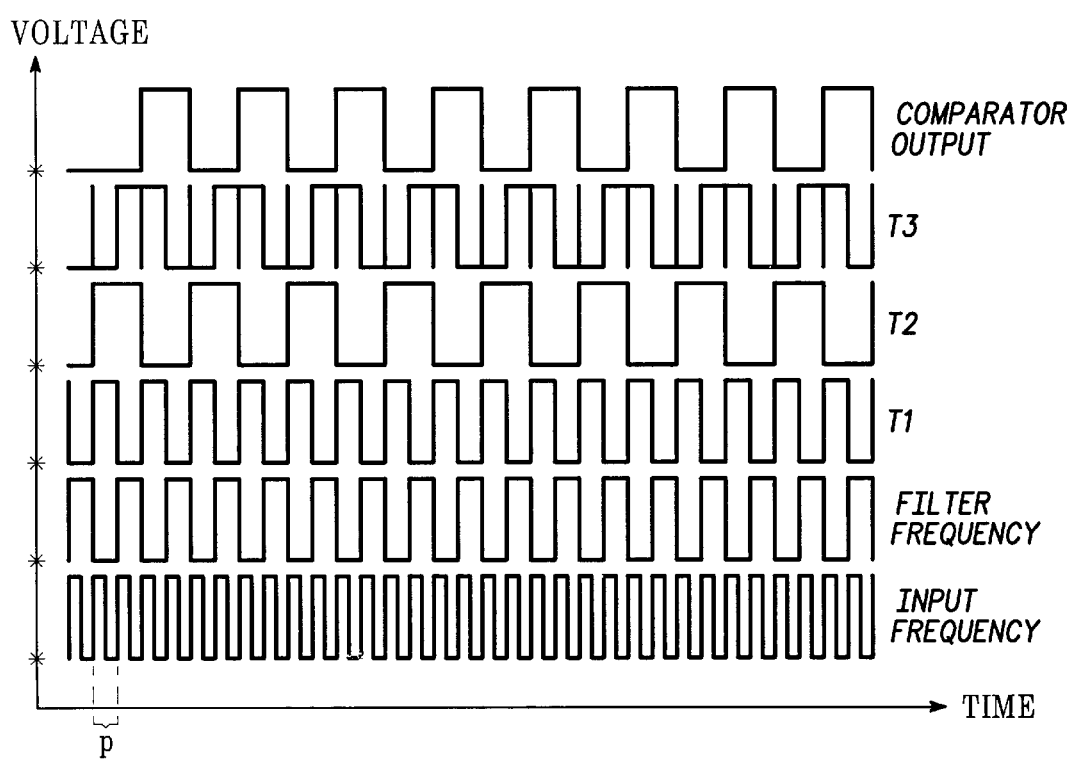
FIG. 3 is a timing diagram illustrating the operation of the frequency comparator of FIG. 2.

How frequency comparator 14 operates when HFF 12 is in operation (i.e. when it is filtering the incoming clock) can be understood in conjunction with the timing diagrams of FIG. 3. As soon as HFF 12 starts to reduce the input frequency to a more suitable frequency, T1 goes high or is asserted and continues to change state after each input clock period, i.e. it will toggle between states. As T1 goes high, T2 also goes high. T2 will stay high until the next positive edge of T1, and will change state on every positive edge of T1. Flip-flop 18 can thus be thought of as a divide-by-two circuit. With both T1 and T2 high, the output (T3) of XOR gate 20 stays low and thus the COMPARATOR OUTPUT remains low. It is only when T1 and T2 differ that T3, the output of XOR gate 20, will be asserted and the COMPARATOR OUTPUT will set the status register to indicate that the HFF is in operation. As FIG. 3 shows, T1 and T2 differ after one input clock period (p) following the initial change in state of T1 and remain different for two input clock periods. T1 and T2 are the same for the next two input clock periods, so that T3 changes state every two input clock periods. Ideally, T3 could be used to set that status register to indicate that the HFF is in operation; however, as can be seen in the timing diagram of T3 in FIG. 3, an unwanted spike occurs in T3 every two input clock periods. This is because of an inherent delay which will occur between the change of state of T1 and the change of state of T2. Ideally, the change in T2 should coincide with the change in T1, but in practice the change in T2 is likely to be slightly delayed, resulting in a spike just after each positive input clock edge. To filter out this spike, the third flip-flop 22 is added. Flip-flop 22 removes the spike by only passing through the value of T3 on each positive clock edge, thereby ignoring the spike. The COMPARATOR OUTPUT of flip-flop 22 is then used to set a status register to indicate that the HFF is in operation.

Figure 4:
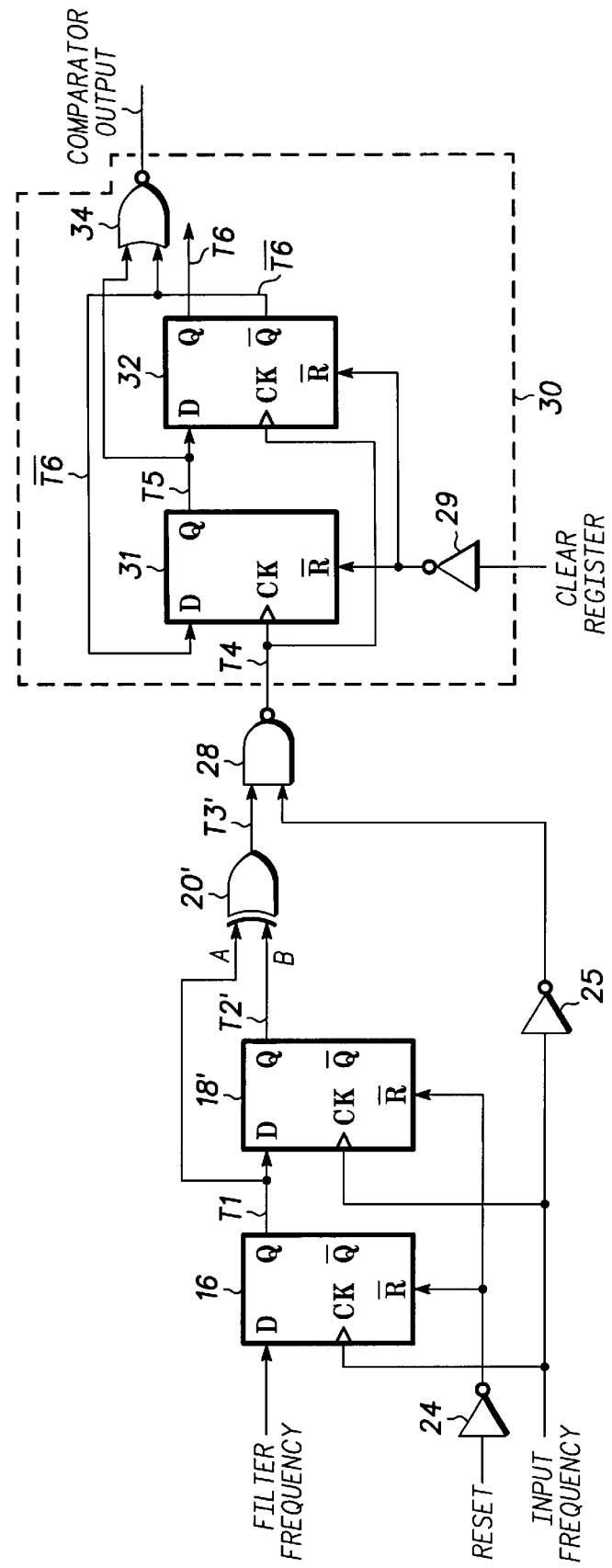
FIG. 4 is a schematic diagram of an alternative frequency comparator in accordance with another embodiment of the present invention.

FIG. 4 illustrates an alternative embodiment for a frequency comparator comparator circuit, shown as a circuit 26. Circuit 26 includes several of the same elements as in the first described embodiment, and thus common reference numerals and names are used as appropriate. Circuit 26 includes first flip-flop 16, a second flip-flop 18', an XOR gate 20', inverter 24, an inverter 25, a NAND gate 28, an inverter 29, a third flip-flop 31, a fourth flip-flop 32, and a NOR gate 34. As in the previous embodiment, an inverted RESET signal is coupled to a first input ($\overline{R}$) of flip-flops 16 and 18' to set the initial state thereof. Flip-flop 16 is exactly as in the previous embodiment, having its output (T1) coupled to a second input of second flip-flop 18'. Unlike in the previous embodiment, T1 is coupled to a second input (D) of flip-flop 18' and INPUT FREQUENCY is coupled to a third input (CK). The output of flip-flop 18' is labeled T2', and is coupled to a first input of XOR gate 20'. T1 is coupled to a second input of XOR gate 20'. The output of XOR gate 20', labeled T3', is coupled to a first input of NAND gate 28. The output of inverter 25, whose input is INPUT FREQUENCY, is coupled to a second input of NAND gate 28. The output of NAND gate 28 is a signal labeled T4.

As thus far described, the operation of circuit 26 is very similar to the operation of circuit 14 of FIG. 2. One difference is that rather than the second flip-flop serving as a divide-by-two circuit as in circuit 16, flip-flop 18' mirrors the output of first flip-flop, albeit delayed by one input clock period. XOR gate 20' compares the output of the first and second flip-flops (T1 and T2' respectively).

It is only when T1 and T2' differ that the output of XOR gate 20' (T3') is asserted. Rather than using a third flip-flop to eliminate the spikes in T3', NAND gate 28 is used. NAND gate 28 only passes the value of T3' through when the INPUT FREQUENCY signal is low or negated.

Accordingly, the portion of circuit 26 which includes flip-flop 16, flip-flop 18', XOR gate 20', inverters 24 and 25, and NAND gate 28 could be used in place of circuit 14 of FIG. 2, with the output of NAND gate 28 being the COMPARATOR OUTPUT. But as shown in FIG. 4, an additional portion of circuit 26 is included, namely a counter portion 30. It is noted that counter portion 30 is an optional portion of a high frequency detection circuit in accordance with the invention, and further that inclusion of a counter portion is not limited to the embodiment shown in FIG. 4 (e.g. it could also be added circuit 14 of FIG. 2 or an otherwise suitable frequency comparator circuit).

Figure 6:
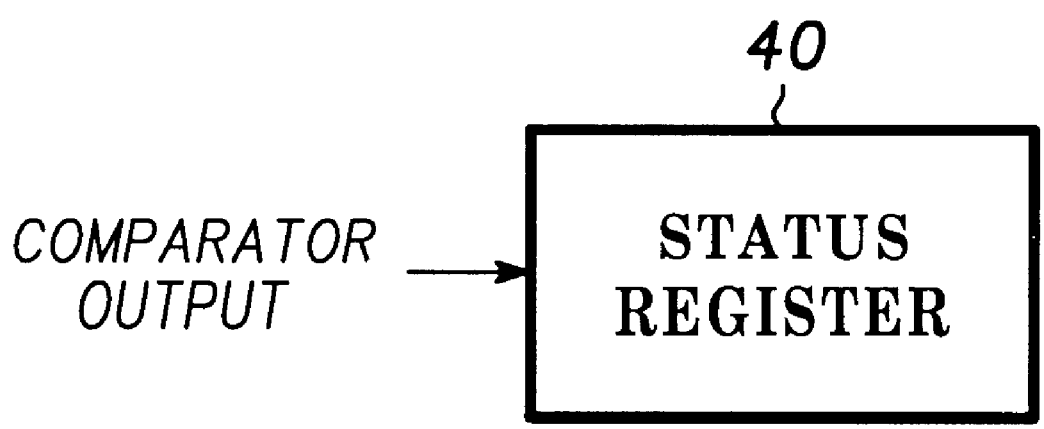
FIG. 6 is a block diagram of a status register useful in receiving an output from the circuits of FIGS. 1, 2, and 4.

Counter portion 30 includes inverter 29, third flip-flop 31, fourth flip-flop 32 and NOR gate 34. An inverted REGISTER CLEAR signal is coupled to a first input ($\overline{R}$) of each flip-flop to bring them to known state before the microcontroller checks a status register 40 shown in FIG. 6 to determine if the HFF is in operation. In this embodiment of the invention, before checking the operation of the HFF, the microcontroller software first clears the status register to remove any incorrect latched values resulting from any incorrect clock signals during power up of the system. The CLEAR REGISTER signal shown in FIG. 4 is asserted while the status register is cleared by software, resulting in flip-flops 31 and 32 of FIG. 4 being negated or cleared at this time as well.

Continuing with counter portion 30 of FIG. 4, the output of NAND gate 28 (T4) is coupled to a second input (CK) of flip-flop 31 and a second input (CK) of flip-flop 32. An output (Q) of flip-flop 31, labeled T5, is coupled to a third input (D) of flip-flop 32 and to a first input of NOR gate 34. An output (Q) of flip-flop 32 is labeled T6. An inverted output ($\overline{Q}$) of flip-flop 32, labeled ($\overline{T6}$), is coupled to a third input (D) of flip-flop 31 and to a second input of NOR gate 34. An output of NOR gate 34 is COMPARATOR OUTPUT.

Figure 5:
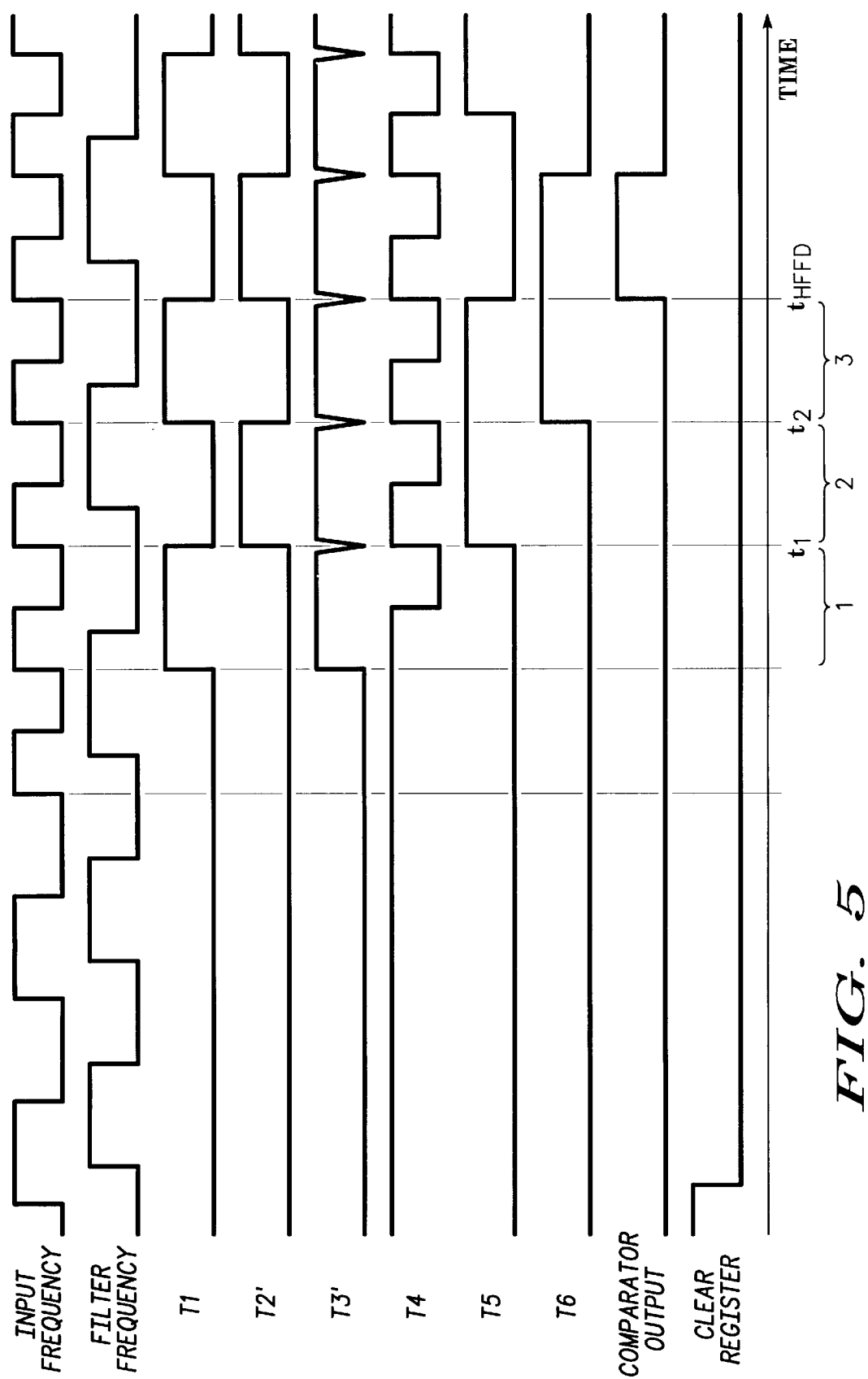
FIG. 5 is a timing diagram demonstrating the operation of the counter portion of FIG. 4.

Counter portion 30 serves to delay assertion of COMPARATOR OUTPUT (e.g. delays setting the status register which indicates that the HFF is in operation) for a period of three input clock periods, albeit a longer or shorter delay could be implemented if desired. The purpose of delaying assertion of COMPARATOR OUTPUT is simply to ensure that the initial indication that the HFF is working (e.g. assertion of T3' in circuit 26) is in fact accurate and not just an anomaly. When T3' is asserted, the INPUT FREQUENCY is transmitted to counter 30 via NAND gate 28. When T3' is negated, the T4 clock to counter 30 is kept high. COMPARATOR OUTPUT of circuit 26 is the output of counter portion 30. Its value will be equal to T6·$\overline{T5}$. As shown in the timing diagram of FIG. 5, COMPARATOR OUTPUT will stay negated, i.e. at a logic level low, for three input clock periods after T3' has been asserted. Assume T5 and T6 start in a low or negated state after CLEAR REGISTER has been asserted. T5 will first be asserted on the next positive clock edge after T3' is asserted, shown as $t_1$ in FIG. 5. Thus on the next positive clock edge, T6 is asserted as shown by $t_2$. COMPARATOR OUTPUT is asserted on the positive edge of the third clock period ($t_{HFFD}$) following assertion of T3' as illustrated in FIG. 5. As stated previously, assertion of COMPARATOR OUTPUT sets a status register which indicates whether the HFF is in operation.

Apart from the advantage the present invention provides from a security perspective, it is noted that the present invention can also be used to characterize the operation of the HFF. For example, during testing of the IC it can readily be determined at which frequency the HFF begins to filter. A progressively increasing frequency of an incoming clock signal can be used during test, and the corresponding status register checked to determine what clock frequency first sets the status register. This information can then be used to determine if the device is operating within its specification.

Thus it is apparent that there has been provided, in accordance with the invention, a high frequency detection circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the invention. For example, it is not a requirement that the final output of the high frequency detection circuit be used to set a status register. As one alternative, the output might be directly used to force the device into a reset or power-down condition. Another alternative is to trigger a microcontroller interrupt. However, the use of a status register is intended to provide flexibility to a microcontroller programmer, giving him or her the option of what to do in case a high frequency input clock is detected. In addition, the invention is not limited to the particular frequency comparator circuits described in reference to FIGS. 2 and 4. It is envisioned that a variety of frequency comparator circuits could be used in conjunction with a HFF to provide the benefits of the present invention. For example, the first flip-flop 16 in both embodiments (i.e. the one with FILTER FREQUENCY and INPUT FREQUENCY as inputs) is the flip-flop that actually does the comparison of these two frequencies. Any circuit which performs this comparison and processes it to provide an indication that an HFF is in operation is considered within the scope of invention. Therefore, it is intended that the invention encompass all such variations and modifications as fall within the scope of the appended claims.

What is claimed is:

1. A high frequency detection circuit comprising:
   an input signal having an input frequency;
   a high frequency filter which provides an output signal having a frequency less than the input frequency when the input frequency is greater than a predetermined frequency; and
   a frequency comparator which compares the input frequency with the frequency of the output signal of the high frequency filter.

2. The circuit of claim 1 further comprising a register, wherein the frequency comparator has an output which sets the register when the frequency of the output signal is less than the input frequency.

3. The circuit of claim 1 wherein the frequency comparator comprises a first flip-flop circuit having a first input coupled to the input signal, a second input coupled to the output of the high frequency filter, and an output.

4. The circuit of claim 3 wherein the frequency comparator comprises a second flip-flop circuit having a first input coupled to the output of the first flip-flop, an output, and a second input coupled to an inverted signal of the output of the second flip-flop.

5. The circuit of claim 4 wherein the frequency comparator comprises an XOR gate having a first input coupled to the output of the first flip-flop, a second input coupled to the output of the second flip-flop, and an output.

6. The circuit of claim 5 further comprising a counter having an input coupled to the output of the XOR gate, and wherein the counter imposes a predetermined delay between an initial detection that the input frequency is higher than the frequency of the output signal of the high frequency filter and setting of the register.

7. The circuit of claim 3 wherein the frequency comparator comprises a second flip-flop circuit having a first input coupled to the output of the first flip-flop, an output, and a second input coupled to the input signal.

8. The circuit of claim 7 wherein the frequency comparator comprises an XOR gate having a first input coupled to the output of the first flip-flop, a second input coupled to the output of the second flip-flop, and an output.

9. The circuit of claim 8 further comprising a counter having an input coupled to the output of the XOR gate, and wherein the counter imposes a predetermined delay between an initial detection that the input frequency is higher than the frequency of the output signal of the high frequency filter and setting of the register.

10. A method for detecting a high frequency signal comprising the steps of:

receiving an input signal having an input frequency;

reducing the input frequency when the input frequency is above a predetermined frequency; and detecting whether a reduction in the input frequency has occurred by comparing said frequency with the reduced frequency to provide a detection signal.

11. The method of claim 10 further comprising the step of setting a status register upon detecting that the reduction has occurred.

12. The method of claim 11 wherein the step of setting a status register upon detecting that the reduction has occurred is delayed by a predetermined period of time following an initial detection in the reduction.

* * * * *